United States Patent [19]

Kajiwara et al.

[11] Patent Number: 5,262,247
[45] Date of Patent: Nov. 16, 1993

[54] THIN COPPER FOIL FOR PRINTED WIRING BOARD

[75] Inventors: Toshiyuki Kajiwara; Yoshinori Tanii; Kazuhiko Hashimoto, all of Kyoto, Japan

[73] Assignee: Fukuda Kinzoku Hakufun Kogyo Kabushiki Kaisha, Kyoto, Japan

[21] Appl. No.: 982,689

[22] Filed: Nov. 30, 1992

Related U.S. Application Data

[63] Continuation-in-part of Ser. No. 524,755, May 17, 1990, abandoned.

[30] Foreign Application Priority Data

May 17, 1989 [JP] Japan ............................ 1-123496
Oct. 12, 1989 [JP] Japan ............................ 1-265680

[51] Int. Cl.⁵ .............................................. B32B 15/20
[52] U.S. Cl. .................................... 428/607; 428/612; 428/632; 428/687; 428/675
[58] Field of Search ............... 428/612, 675, 671, 632, 428/607, 687

[56] References Cited

U.S. PATENT DOCUMENTS 4,394,419  7/1983  Konicek ........................ 428/675
4,661,417  4/1987  Suzuki et al. .................. 428/612

FOREIGN PATENT DOCUMENTS 57-02034  7/1982  Japan ............................ 428/607

*Primary Examiner*—Michael Lewis
*Assistant Examiner*—Valerie A. Lund
*Attorney, Agent, or Firm*—Lowe, Price, LeBlanc & Becker

[57] ABSTRACT

A thin copper foil for a printed wiring board comprising a copper foil supporter having a surface with a roughness; a parting payer consisting of chrome compound; a thin copper foil layer formed on the parting layer which will be attached to a board as printed wiring. A copper-nickel compound metal layer is interposed between the parting layer and the thin copper foil layer, wherein said copper-nickel compound metal layer is formed to be integral with the thin copper foil layer with a peel strength therebetween such that said copper-nickel compound metal layer will be left on the thin copper layer when the parting layer with the copper foil supporter is peeled off.

2 Claims, 2 Drawing Sheets

THIN COPPER FOIL FOR PRINTED WIRING BOARD

This application is a continuation-in-part application of U.S. Ser. No. 07/524,755 filed May 17, 1990 is now abandoned.

BACKGROUND OF THE INVENTION

1. Field of the Invention

The present invention relates to a thin copper foil for a printed wiring board and more particularly to the thin copper foil with a peelable copper foil supporter, which has stabilized a strength between the supporter and the thin copper foil having a thickness less than 12 μm.

2. Description of the Prior Art

Recently, circuits in a printed wiring board assembled in electronic machines are going to high density and electric conductors of the circuits tend to be extremely fine according to rapid progress of miniaturization of the electronic machines.

To fulfill these requirements, it is common to use a thin copper foil having a thickness of less than 12 μm wherein side etching seldom occurs. Since these thin copper foils are weak, it is difficult to use them as they are easily creased or torn in handling. Therefore, as a copper foil for an outer layer of a multilayer printed wiring board, a thin copper foil with a supporter is used, including an aluminium foil or a copper foil. A thin copper foil layer is electrically deposited on one side of the supporter, this thin layer having a thickness of less than 12 μm.

As an example, it has been proposed to use a supporter which is prepared by depositing a chrome metal on a surface of a side of an electrolytic copper foil by means of chrome plating or the like. A thin copper foil layer is then deposited on the chrome metal so as to make a thin copper foil with a peelable deposited copper foil surpporter (See Japanese patent publication Sho. 53-18329).

As another example, it has been proposed to use a four layer metal wiring foil. The supporter comprises copper, and a chromate film which is electrolytically formed on the shiny side of the copper foil supporter layer as a parting layer. The wiring foil also includes a metal "release" layer of copper-nickel alloys formed on the chromate release layer and a further thin copper non-self supporting layer in the metal "release" layer. The 3 layers composed of the copper foil supporter, the chromate film and the metal "release" layer are released except for the thin copper foil layer of the outer layer after laminating on a substrate. (See Japanese patent Sho. 57-20347.)

To make a multilayer board by using the thin copper foil with the supporter, it was carried out through such steps as shown in FIG. 2.

First, a prepreg comprising glass and epoxy was laid on both sides of a printed wiring board for inner layer and a copper foil with a supporter is laid on the outer side of the prepreg to face the copper foil supporter outwardly and then these were laminated one another under high pressure and temperature. The finished multilayer board were drilled at desired positions thereof and then the copper foil supporter was peeled off mechanically. Thereafter, in order to form an electric conductor in each of the drilled holes, electroless plating was applied thereto after a step of pretreatment. Next, the portions of the board except the circuit portions to be necessitated were covered with a photoresist. A thin copper plating was given to the circuit portions and the electric conductor in the hole using a copper electroplating bath for through-holes and soldering was carried out thereon and thereafter the photoresist was removed. Finally, the laminated board was etched with an etching liquid of alkaline ammonia using a quick etching method so as to produce a multilayer printed wiring board.

However, there remained some troubles when producing the thin copper foil with the supporter and also when producing a multilayer board by using same.

For instance, since a peel strength between the copper foil supporter and the thin copper layer, was dispersed widely and therefore the following troubles occurred to the thin copper foil with the supporter.

Where the peel strength was too weak, there were the following drawbacks.

① When the thin copper foil with the supporter was laminated with the prepreg under high pressure and temperature and at the time of taking out its laminated board from a press machine or at the time of cutting same in a desired size, the copper foil supporter was peeled off naturally and therefore there was the danger that the thin copper foil layer on the surface of the laminated board would be damaged during handling of the laminated board.

② In the process of drilling the laminated board, when a drill was withdrawn from the drilled hole, the copper foil supporter was peeled off and lifted from the board. As the result, the drilling process could not be continued.

Conversely, when the peel strength of the supporter was too strong, there were the following disadvantages.

③ After drilling, when the supporter was peeled off from the board mechanically, a part of the thin copper foil layer was damaged or broken at an end thereof located around the holes.

④ Particularly, in a case of a large laminated board a large force is required to peel the supporter off from the board.

⑤ In the case of Japanese patent 53-18329, a part of the chromate plating layer would sometimes be left on the thin copper foil layer after peel of the supporter. Also, in the case of Japanese patent 57-20347, the copper-nickel compound layer would sometimes be on the thin copper foil layer, as shown in FIG. 4. As the result, to remove the remaining layer, polishing or etching was required. However, it was practically impossible to remove the remaining copper-nickel compound layer from such a thin copper foil, and therefore the board as printed wiring with the thin copper foil including the remaining copper-nickel compound layer could not be used.

⑥ In the case of Japanese patent 53-18329, the supporter peeled off from the board contained a great amount of chrome, and in the case of Japanese patent 57-20347, a great amount of nickel was included. Therefore, those supporters could not be recycled.

⑦ In the case of Japanese patent 53-18329, to produce the thin copper foil with the supporter, it normally used a chromate plating bath of strong acid containing hexavalent chromium ion in high concentration. Therefore, treatment of the waste plating liquid was troublesome and became expensive. Further, in the case of Japanese patent 57-20347, the waste plating liquid was electrolyzed with high current density and as the result a great amount of hazardous mist was produced.

Namely, through examination of the above mentioned disadvantages in connection with the use of conventional copper foil with a supporter, the inventors have found that there occurrs dispersion of a peel strength between the chromate plating layer and the thin copper foil in the case of Japanese patent 53-18329, or a peel strength between the copper-nickel compound layer and the thin copper foil in the case of Japanese patent 57-20347, when the supporter is peeled off from the thin copper foil. This dispersion originates in the connection between the parting layer which is formed by means of chrome plating in the case of Japanese patent 53-18329 or by means of copper-nickel plating in the case of Japanese patent 57-20347, and the thin copper foil layer which is formed by means of copper plating. Further, as the other disadvantages, after the peeling off the supporter the board tends to oxidate and soft and thin copper foil layer is left thereon, the surface of the copper becomes oxidated or damaged mechanically unless the next process is applied thereto immediately.

SUMMARY OF THE INVENTION

It is an object of the present invention to solve the above-mentioned problems and provide a thin copper foil for a printed wiring board which can protect the surface of the thin copper foil from oxidation or damages after peeling of a parting layer with a copper foil supporter.

To achieve the object, the thin copper foil for a printed wiring board according to the present invention comprises a copper foil supporter having a surface with a roughness of at least 1 $\mu$m, a parting payer consisting of chrome compound formed by a chromate treatment of first surface, a thin copper foil layer formed on the parting layer which will be attached to a board as printed wiring to thereby form the printed wiring board, and a copper-nickel compound metal layer interposed between the parting layer and the thin copper foil layer, wherein said copper-nickel compound metal layer is formed to be integral with the thin copper foil layer with a peel strength therebetween such that said copper-nickel compound metal layer will be left on the thin copper layer when the parting layer with the copper foil supporter is peeled off.

As the result, when the parting layer with the copper foil supporter is peeled off from the board as printed wiring, the copper-nickel compound metal layer can be left on the thin copper foil layer, as shown in FIG. 3, so that the surface of the thin copper foil layer may be protected from oxidation or damages.

Further, since the copper-nickel compound metal layer can be easily dissolved with soft etching in the next process, this layer can easily be removed when it becomes unnecessary.

Furthermore, since the copper-nickel compound metal layer is left on the board together with the thin copper foil layer, the copper foil supporter does not include the copper-nickel compound and therefore the copper foil supporter can be easily recycled as copper.

Other objects and advantages of this invention will be apparent from the detailed description of the embodiments with reference to the drawings.

BRIEF DESCRIPTION OF THE DRAWINGS

The drawings show embodiments of a thin copper foil for a printed wiring board and a method of manufacturing same in which.

DETAILED DESCRIPTION OF THE EMBODIMENTS

First Embodiment

Figure 1:
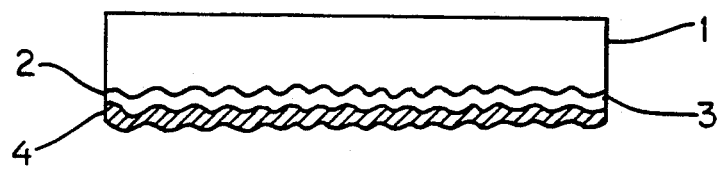
FIG. 1 is a sectional view of a thin copper foil with a supporter.
Figure 2:
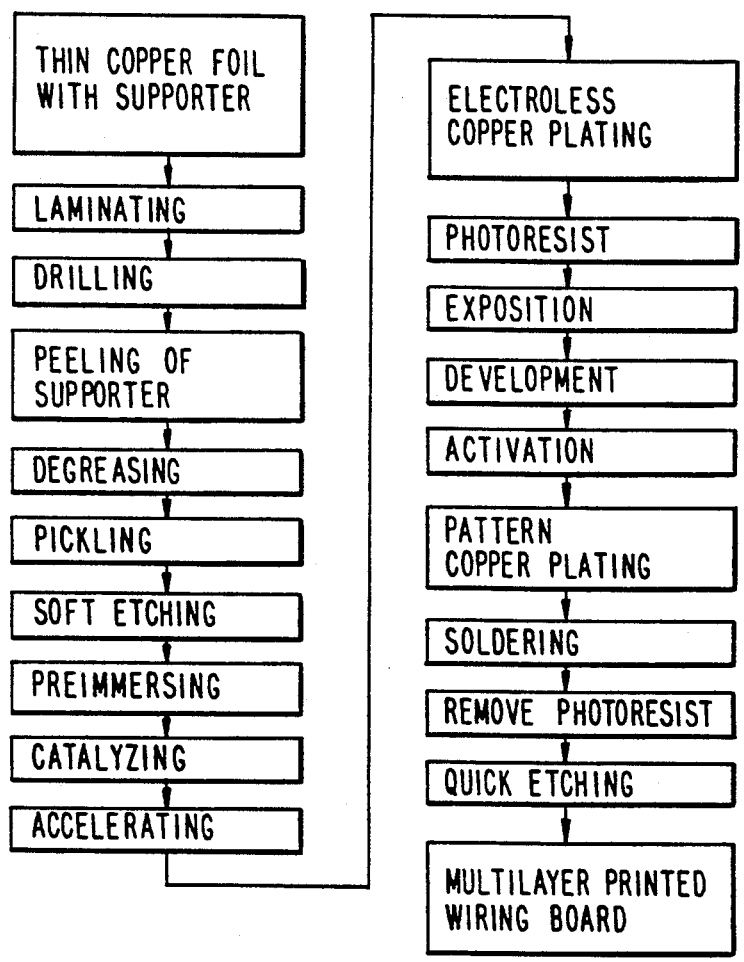
FIG. 2 is a diagram showing steps of manufacturing a multilayer printed wiring board using the copper foil with a supporter.
Figure 3:
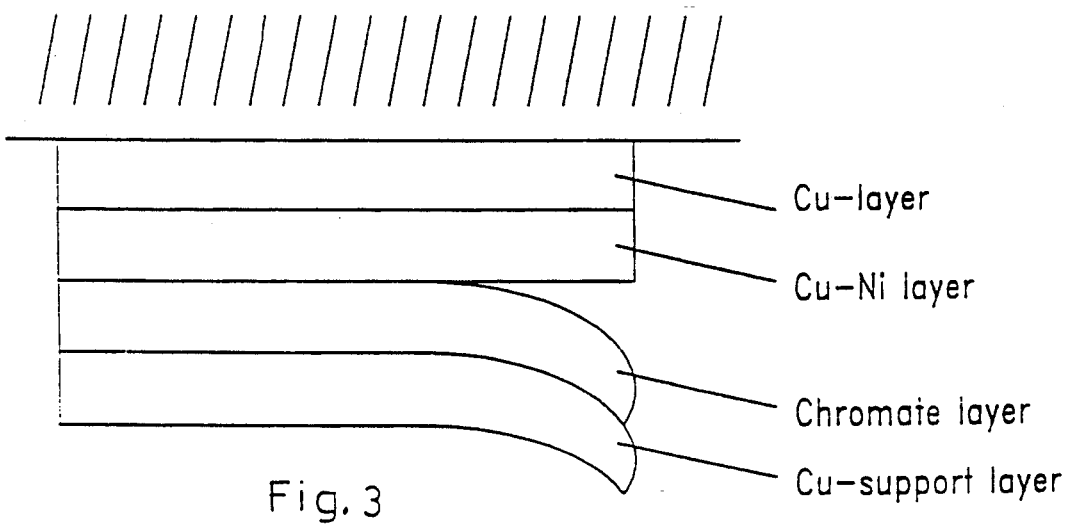
FIG. 3 is a sectional view of the thin copper foil showing the peeling function of the present invention.
Figure 4:
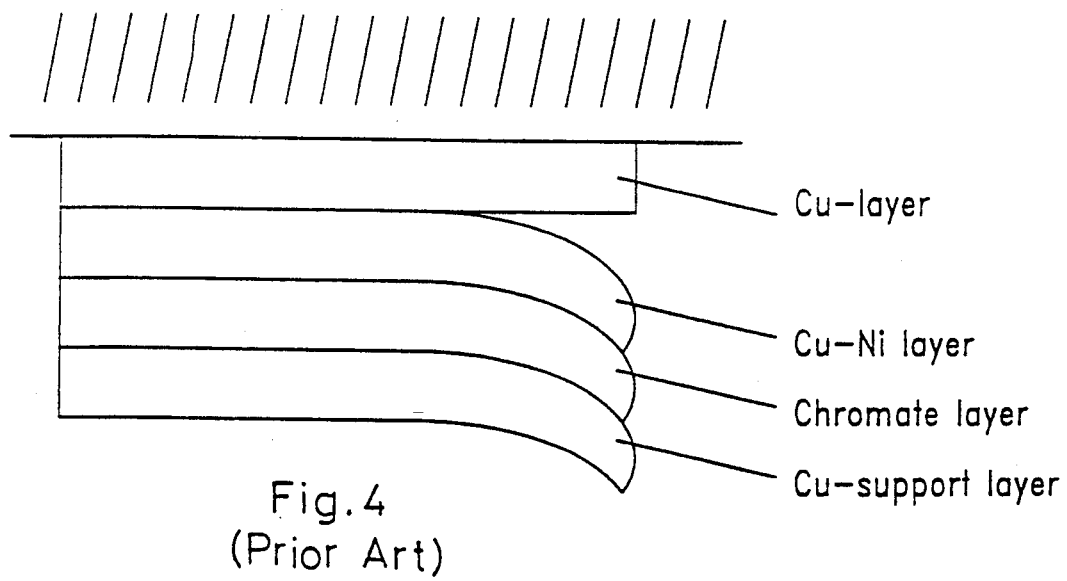
FIG. 4 is a sectional view showing the thin copper foil showing the peeling function of the prior art.

As a supporter, an electrolytic copper foil was soaked in sulfuric acid of 5 weight % for 20 seconds and thereafter washed with water for 20 seconds. The electrolytic copper foil had a thickness of 70 $\mu$m and a rough surface on a side thereof which surface had a difference of 5 $\mu$m between absolute top and bottom of rough. The supporter was soaked in a bath of chromate solution for 60 seconds which solution was prepared by dissolving sodium dichromate in water at a concentration of 20 g per liter (7.9 g per liter as hexavalent chromium ions), so as to form a parting layer thereon. The chromate bath had 4.1 pH and a temperature of 25° C. The supporter was washed with water for 20 seconds and thereafter immersed in a plating bath of copper and nickel compound metal as identified below, so as to form a copper-nickel layer of 1.0 $\mu$m in thickness on the rough surface thereof by means of cathodic electrolysis.

| | |
|---|---|
| Copper sulfate (5H$_2$O) | 0.08 mole/l |
| Nickel sulfate (6H$_2$O) | 0.16 mole/l |
| Citric acid | 0.5 mole/l |
| pH | 5.2 |
| Bath temperature | 40° C. |
| Current density of cathode | 3 A/dm$^2$ |
| Time | 4 minutes |

Analysis of the compound metal deposited in this plating showed copper of 75 weight % and nickel of 25 weight %.

Then, the supporter was washed with water for 30 seconds and thereafter a thin foil layer of 5 $\mu$m was formed on the compound metal layer by utilizing a plating bath of copper-pyrophosphate, which is identified below.

| | |
|---|---|
| Copper pyrophosphate | 80 g/l |
| Potassium pyrophosphate | 290 g/l |
| Ammonia water (Specific gravity: 0.85) | 3 ml/l |

The copper plating bath had pH of 8.7 and a temperature of 57° C. and the plating was carried out with a current density of cathode of 4 A/dm$^2$ for 5 minutes and 38 seconds. Thereafter, the thin copper foil with the supporter was washed with water for 30 seconds and immediately dried by a hot air dryer.

To make a multilayer printed wiring board, a glass-epoxy prepreg (NEMA grade FR-4) was laid on both sides of an inner layer panel or board and further the thin copper foil with the supporter was laid thereon in such a manner that the thin copper foil layer faced the prepreg, and thereafter laminated under the conditions of high pressure and temperature (at 165° C. under 50 kg/cm² for 60 minutes). Next, holes were formed in the laminated board by means of a drill having a diameter of 1 mm and then the copper foil supporter was peeled off from the laminated board. The peel strength of the supporter was 60 g/cm and its peeling was easily carried out by hand over the laminated board. Further, no partial separation was found on the compound metal layer around the drilled holes. To form an electric conductor in each of the holes of the laminated board, a tendency of soft-etching was checked by immersing in a aqueous solution in which ammonium persulfate was dissolved at a concentration of 100 g/l after decreasing the board and pickling same. As the result, the compound metal layer of a grayish white color on the surface of the board was completely dissolved and the thin pink copper foil appeared. Thereafter, predipping, catalyzing and accelerating treatments were applied to the board and electroless copper plating was carried out. Next, predetermined portions of the board other than required circuit rooting portions were covered with a photoresist. A thin copper plating was applied to the circuit portions and the electric conductor in the holes using a copper electroplating bath for through-holes and soldering was carried out thereon. Thereafter, the photoresist used was removed. Finally, the laminated board was etched with an etching liquid of alkaline ammonia in a manner of quick etching so as to make a multilayer board.

The resulting structure is shown in FIG. 1. Copper foil supporter layer 1 has a surface roughness of 1 to 9 μm. Parting layer 2 includes chromatic compounds. Copper-nickel metal layer 3 has a thickness between 0.01 and 6 μm.

The appraisal is shown in Table 1, which follows the end of description of the embodiment.

Second Embodiment

A rolled copper foil having a thickness of 70 μm was immersed in a aqueous solution of dissolved ammonium persulfate at a concentration of 100 g/l to roughen the surface of the foil.

With immersion the copper foil at a temperature of 40° C. for 60 seconds, the rough surface showed a roughness value of 1.0 μm as a difference between absolute top and bottom thereof.

The rolled copper foil having rough surfaces was washed with water for 45 seconds and then immersed in a chromate bath as identified below so as to form a parting layer on the rough surfaces.

| Chromium trioxide | 1 g/l |
|---|---|
| Potassium dichromate | 3 g/l |
| pH | 2.2 |
| Bath temperature | 25° C. |
| Immersing time | 60 seconds |

Thereafter, the foil was washed with water for 10 seconds and only a side thereof was immersed in a plating bath of copper-nickel compound as identified below and subject to cathodic electrolysis so as to plate the foil with copper-nickel compound with a thickness of 1.0 μm.

| Copper sulfate (5H₂O) | 0.04 mole/l |
|---|---|
| Nickel sulfate (6H₂O) | 0.15 mole/l |
| Citric acid | 0.4 mole/l |

A plating bath of the compound metal had a pH of 5.5. The plating was carried out at a bath temperature of 40° C. and with a current density of 3.0 A/dm² for 4 minutes. The compound metal layer contained a copper of 35 weight %. A supporter with the compound metal plating was washed with water and thereafter a thin copper foil layer was formed on the compound metal layer with a thickness of 5 μm by using a plating bath of copper sulfate as identified below.

| Copper sulfate (5H₂O) | 240 g/l |
|---|---|
| Sulfuric acid | 70 g/l |

The plating bath was maintained at a temperature of 40° C. and the plating was carried out with a cathodic current density of 3 A/dm² for four and a half minutes. Thereafter, to increase bonding strength with respect to a glass-epoxy prepreg, a copper dendrite was electrically deposited on the surface of the thin copper foil layer by using a rough treatment bath as identified below.

| Copper sulfate (5H₂O) | 120 g/l |
|---|---|
| Sulfuric acid | 60 g/l |
| Nitric acid | 20 g/l |

The plating bath was maintained at a temperature of 40° C. and the plating was carried out with a cathodic current density of 25 A/dm² for 2 minutes. Next, the supporter was laminated with the prepreg under the same conditions as the first embodiment. Then, the laminated board was checked for peeling strength of the supporter, the presence of exfolitation of the copper-nickel compound metal layer around the drilled holes and for soft etching with respect to the compound metal layer.

The appraisal is shown in Table 1.

Third to Thirteenth Embodiments

Electrolytic copper foils for a printed wiring board were utilized. The copper foils had a thickness of 18 μm, 35 μm, and 70 μm, respectively and provided with a rough surface on a side of each thereof. The rough side of each of the foils were immersed in sulfuric acid of 3 weight % for 30 seconds at room temperature and then washed with water for 60 seconds. A parting layer, a copper-nickel compound metal layer and a thin copper foil layer were applied to each of the electrolytic copper foils to obtain a thin copper layer with a supporter, respectively. Each of the copper layers with the supporter was laminated with a prepreg under the same conditions as the first embodiment and then each of the laminated boards were respectively checked for the peel strength of the supporter, the presence of exfolitation of the copper-nickel compound metal layer around the drilled holes and tendency of soft etching with respect to the compound metal layer.

The appraisals are shown in Table 1.

It is clear from the above mentioned results that a suitable and stable peel strength of the supporter is obtained at all times by utilizing the copper foil supporter having rough surfaces and interposing the copper-nickel compound metal layer between the parting layer and the thin copper foil layer, thereby inhibiting peeling of the supporter away from the laminated board.

TABLE 1

| | Supporter | | Parting layer | | Cu—Ni Compound Metal Layer | | |
|---|---|---|---|---|---|---|---|
| | | | | | Composition of Com. Metal Plating Liquid | | |
| | Thickness $\mu m$ | Roughness of Rough Surface *1 $\mu m$ | Concentration of Chromate Bath g/l | Conditions of Treatment *2 pH | Copper Sulfate (5 $H_2O$) | Nickel Sulfate (6 $H_2O$) mole/l | Citric Acid |
| 1 | 70 | 5.0 | $Na_2Cr_2O_7$:20 | 4.1 | 0.08 | 0.16 | 0.5 |
| 2 | " | 1.0 | $CrO_3$:1 | 2.2 | 0.04 | 0.15 | 0.4 |
| | | | $K_2Cr_2O_7$:3 | | | | |
| 3 | " | 10.0 | $K_2Cr_2O_7$:20 | 4.2 | 0.08 | 0.16 | 0.5 |
| 4 | 18 | 2.0 | $CrO_3$:10 | 6.4 *5 | 0.12 | 0.24 | " |
| 5 | 35 | 4.0 | $Na_2Cr_2O_7$:20 | 4.1 | 0.08 | 0.18 | " |
| 6 | 70 | 7.0 | " | " | " | " | " |
| 7 | 100 | 10.0 | " | " | " | " | " |
| 8 | 70 | 5.0 | " | " | 0.04 | 0.24 | 0.4 |
| 9 | " | " | " | " | 0.12 | 0.07 | 0.3 |
| 10 | " | " | " | " | 0.08 | 0.16 | 0.5 |
| 11 | " | " | " | " | " | " | " |
| 12 | " | " | " | " | " | " | " |
| 13 | " | " | " | " | " | " | " |
| 1 | 70 | Luster Surface (0.2 $\mu m$) | Cr Plating Layer (0.06 $\mu m$) | | | | |
| 2 | 70 | Rough Surface (0.5 $\mu m$) | Cr Plating Layer (1.0 $\mu m$) | | | | |

| Cu—Ni Compound Metal Layer Conditions of Plating | | | | Cu Foil Layer | | Appraisal | | |
|---|---|---|---|---|---|---|---|---|
| Time of Plating pH | Minutes | Thickness $\mu m$ | Composition of Com. Metal wt % Cu | Plating Bath | Thickness $\mu m$ | Peel Strength g/cm | Damage of Copper Foil Around Drilled Holes | Capability of Soft Etching of Com. Metal Layer *4 |
| 5.2 | 4.0 | 1.0 | 75 | Copper Pyrophosphate*# | 5.0 | 60 | None | Good |
| 5.5 | " | " | 35 | Copper Sulfate | " | 35 | None | Good |
| 5.2 | " | " | 75 | Above # | " | 100 | None | Good |
| " | 0.4 | 0.1 | " | " | " | 40 | None | Good |
| " | 4.0 | 1.0 | " | " | " | 55 | None | Good |
| " | " | " | " | " | " | 80 | None | Good |
| " | " | " | " | " | " | 115 | None | Good |
| " | " | " | 13 | " | " | 65 | None | Good |
| 5.4 | " | " | 86 | " | " | 63 | None | Good |
| 5.2 | 24.0 | 6.0 | 75 | " | " | 68 | None | Good |
| " | 4.0 | 1.0 | " | " | " | 65 | None | Good |
| " | " | " | " | " | 1.0 | 61 | None | Good |
| " | " | " | " | " | 1.9 | 64 | None | Good |
| | | | | " | 5.0 | 150~500 | Damage found | — |
| | | | | " | " | 2 | — | — |

*1 Value showing a difference between the absolute top and bottom.
*2 Bath temperature constant at 25° C. Immersing time constant for 60 seconds.
*3 Bath temperature constant at 40° C. Current density constant at 3 A/dm².
*4 Checking if the compound metal layer is solved completely by immersing same in an aqueous solution including an ammonium persulfate of 100 g/l. When solved, its appraisal is good.
*5 The pH is controlled with a caustic soda.

COMPARATIVE EXAMPLE-1

As a supporter, a rolled luster copper foil, which had a rough surface having a roughness difference of 0.2 $\mu m$ between the absolute top and bottom of the rough, was immersed in a sulfuric acid of 5 weight % at a temperature of 25° C. for 60 seconds and washed with water for 30 seconds. Then, a side of the copper foil was immersed in a plating bath as identified below and subject to cathodic electrolysis to form a chrome plating of 0.06 $\mu m$ on the side of the foil.

| Chromium trioxide | 350 g/l |
|---|---|
| Sulfuric acid | 3.5 /l |
| Bath temperature | 27° C. |
| Cathodic Current density | 11.0 A/dm² |
| Immersing time | 30 seconds |
| Amode | Lead |

After the chrome deposited supporter was washed with water for 60 seconds, a thin copper foil layer of 5.0 $\mu m$ in thickness was formed thereon by using a plating bath of copper pyrophosphate and the same plating conditions as the first embodiment. Thereafter, the thin copper foil layer with the supporter was immediately washed with water for 30 seconds and dried by a hot air dryer. The thin copper foil with the supporter was laminated with a prepreg under high pressure and high temperature (at 165° C. under 50 kg/cm² for 60 seconds) and holes formed using a drill having a diameter of 1 mm after which the supporter was peeled off. The peel strength of the supporter varied widely from 150 to 500 g/cm. A part of the thin copper foil layer around the drilled holes was damaged by the supporter which was peeled off.

COMPARATIVE EXAMPLE-2

A copper foil having a thickness of 70 $\mu m$ and rough surfaces having a roughness of 5 $\mu m$ was used as a supporter. The rough surface of the copper foil was pickled, washed with water and deposited with chrome in the same manner as the comparative example-1. The immersing time was controlled to obtain a 1 $\mu m$ thick chrome plating. The chrome deposited supporter was washed with water for 45 seconds and a thin copper foil layer having a thickness of 5 $\mu m$ was formed using a plating bath of copper pyrophosphate which was the same as the first embodiment. Thereafter, it was washed with water for 30 seconds and dried. Then, the thin copper foil layer with the supporter was laminated with a prepreg (NEMA grade FR-4) under high pressure and temperature (at 165° C. under 50 kg/cm² for 60 seconds) in such a manner that the thin copper foil layer faced the prepreg. While the laminated board was taken out from a press machine, swelling of the copper foil supporter was found having a diameter of 1 to 2 cm on the surface of the laminated board. When the laminated board was cut to a required size, the copper foil supporter was peeled off from the board and it became difficult to drill in the next step. The peel strength of the supporter was measured to be 2 g/cm.

Through the first and second embodiments as well as the comparative examples 1 to 13, the following facts should be noted.

As the thin copper foil for the printed wiring board:

Through the test and checking of the peel strength of the supporter, it is found that there is no particular problem in the course of processes necessary for a printed wiring board in the event that the peel strength belongs to a range of 20~200 g/cm with a test of peeling at 90 degrees.

Where the peel strength is less than 20 g/cm, it will be dangerous that the copper foil supporter is peeled off while laminating the prepreg and the thin copper foil with the supporter under high pressure and temperature or while drilling the thin copper foil. Further, it is found that it is preferable not to exceed a peel strength of 200 g/cm, since great force is necessary to peel off the copper foil supporter particularly in a case that the laminated board is prepared in large scale and it becomes sometimes dangerous that the thin copper foil layer is damaged or broken around the drilled holes.

On the basis of the tests described above, the inventors have checked the influence of a shape of the rough surface of the copper foil supporter on the peel strength of the supporter. As the result, it has been found that a surface roughness of the rough surface in a range of 1~10 $\mu$m between the absolute top and bottom of the rough surface is preferred. However, it is preferable not to have a roughness of less than 1 $\mu$m, because the peel strength between the parting layer and the copper-nickel compound metal layer sometimes becomes less than 20 g/cm. If the surface roughness exceeds 10 $\mu$m, the peel strength can exceed 200 g/cm.

The thickness of the copper foil supporter is preferably in the range of 18 $\mu$m to 100 $\mu$m with a nominal value of 70 $\mu$m. It is preferable to have a thickness of the copper foil supporter greater than 18 $\mu$m, since creases occur with a thinner copper foil supporter if the copper-nickel compound metal layer has a thickness of 6.0 $\mu$m and the thin copper foil layer has a thickness of 9.0 $\mu$m, both laminated together via a parting layer by means of a plating process.

Conversely, it is preferable in such a case that the thickness of the copper foil supporter not exceed 100 $\mu$m, since the peel strength of the supporter sometimes exceeds 200 g/cm due to rigidity of the copper foil per se.

It is preferable that the parting layer formed on the rough surface of the copper foil supporter is a chrome compound obtained by means of a chromate treatment. As the parting layer, it may be possible to form another parting layer in such a manner that copper oxides, copper sulfide, silver iodide or the like is formed on the copper foil supporter and then a thin copper foil layer is deposited on the parting layer by means of an electric plating process. However, such a manner has to be carried out very carefully in forming the parting layer in order to stabilize the peel strength of the supporter. The parting layer according to the present invention has a characteristic in stabilizing the peel strength of the supporter in such a manner that the copper-nickel compound metal layer is interposed between the thin copper foil layer and the chromate compounds which are obtained by means of a chromate treatment.

Further, it is preferable that the thickness of the compound metal layer is between 0.01 $\mu$m and 6.0 $\mu$m. It is preferable that the thickness not be less than 0.01 $\mu$m, since it causes occurrence of pinholes as the compound metal layer cannot cover the parting layer completely.

The maximum thickness of the compound metal layer is determined according to a dissolving speed in a soft etching process. Normally, according to the conditions used by the manufacturers in the field of printed wiring boards, the amount dissolved is 6.0 $\mu$m per 3 minutes of treatment at maximum. Therefore, it is preferable to control the maximum thickness of the compound metal layer to be less than 6.0 $\mu$m.

The compound metal layer has to be dissolved and removed in a soft etching process for the printed wiring board. A soft etching liquid normally used is an etching liquid which includes at least one of the following sulfuric acid—hydrogen peroxide, persulfates, ferric chloride, cupric chloride or ammonia double salts.

The copper-nickel compound metal layer may be dissolved in general soft etching liquids. it is more preferable that the composition of the copper-nickel compound metal layer includes a copper in a range of 10 to 90 weight %, and is preferable that the copper is not less than 10 weight % since it takes excessive time to carry out soft etching. Further, it is preferable to use the copper-nickel compound metal layer in which a copper not exceed 90 weight % since the peel strength of the supporter sometimes less than 20 g/cm.

The thickness of the thin copper foil layer, which is formed on the copper-nickel compound layer, is preferably within the range of 1~9 $\mu$m. In a soft etching process, the copper-nickel compound layer which is located at the extreme top surface should be completely removed whereby the thin copper foil layer, which is an underlayer, is exposed. It is preferable that the thickness of the thin copper foil layer not be less than 1 $\mu$m, since there is a danger of dissolving and removing the thin copper foil layer with an excessive etching. The thickness of the thin copper foil layer as mentioned before includes the rough surface, though there is a case that the rough surface is formed with the thin copper foil layer in order to improve a bonding strength to the prepreg.

We claim:

1. A thin copper foil for a printed wiring board comprising:
   a copper foil supporter having a surface with a roughness of at least 1 $\mu$m;
   a parting layer consisting of chrome compound formed by a chromate treatment of first surface;
   a thin copper foil layer formed on the parting layer which will be attached to a board as printed wiring to thereby form the printed wiring board; and
   a copper-nickel compound metal layer interposed between the parting layer and the thin copper foil layer, wherein said copper-nickel compound metal layer is formed to be integral with the thin copper foil layer with a peel strength there between such that said copper-nickel compound metal layer will be left on the thin copper foil layer when the parting layer with the copper foil supporter is peeled off.

2. A thin copper foil for a printed wiring board as claimed in claim 1 wherein:

the surface of the copper foil supporter has a roughness within a range of 1–10 μm;

the composition of the copper-nickel compound metal layer includes copper of 1–90 weight % and nickel the remaining percentage and has a thickness of 0.01–6 μm; and the thin copper foil layer has a thickness of 1–10 μm.

* * * * *